(12) United States Patent
Kim

(10) Patent No.: US 10,741,212 B2
(45) Date of Patent: Aug. 11, 2020

(54) ERROR CORRECTION CODE (ECC) ENCODERS, ECC ENCODING METHODS CAPABLE OF ENCODING FOR ONE CLOCK CYCLE, AND MEMORY CONTROLLERS INCLUDING THE ECC ENCODERS

(71) Applicant: SK hynix Inc., Gyeonggi-do (KR)

(72) Inventor: Soo Jin Kim, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 231 days.

(21) Appl. No.: 15/620,909

(22) Filed: Jun. 13, 2017

(65) Prior Publication Data

US 2018/0151197 A1 May 31, 2018

(30) Foreign Application Priority Data

Nov. 25, 2016 (KR) .................. 10-2016-0158369

(51) Int. Cl.
| | | |
|---|---|---|
| G11B 20/18 | (2006.01) | |
| H03M 13/00 | (2006.01) | |
| H03M 13/29 | (2006.01) | |
| H03M 13/11 | (2006.01) | |
| G06F 11/10 | (2006.01) | |
| G11C 29/52 | (2006.01) | |
| H03M 13/15 | (2006.01) | |

(52) U.S. Cl.
CPC ...... *G11B 20/1833* (2013.01); *G06F 11/1068* (2013.01); *G11C 29/52* (2013.01); *H03M 13/1108* (2013.01); *H03M 13/152* (2013.01); *H03M 13/2903* (2013.01); *H03M 13/611* (2013.01); *H03M 13/6502* (2013.01); *H03M 13/6575* (2013.01)

(58) Field of Classification Search
None
See application file for complete search history.

(56) References Cited

U.S. PATENT DOCUMENTS

| | | | | |
|---|---|---|---|---|
| 8,095,859 | B1* | 1/2012 | Peterson | H03M 13/116 714/801 |
| 9,495,243 | B2* | 11/2016 | Lu | G06F 11/1048 |
| 2007/0033485 | A1* | 2/2007 | Cohen | H03M 13/1182 714/758 |
| 2007/0226593 | A1* | 9/2007 | Mead | G11B 20/1833 714/769 |
| 2013/0254639 | A1* | 9/2013 | Krishnan | H03M 13/13 714/800 |
| 2015/0363263 | A1* | 12/2015 | Hassner | H03M 13/1134 714/757 |

* cited by examiner

*Primary Examiner* — Justin R Knapp
(74) *Attorney, Agent, or Firm* — IP & T Group LLP

(57) ABSTRACT

An error correction code (ECC) encoder includes a plurality of exclusive OR (XOR) gates configured to receive a "k"-bit original data in parallel and configured to perform a plurality of XOR operations to the "k"-bit original data to output a "(n−k)"-bit parity data. The "k"-bit original data and the "(n−k)"-bit parity data form an "n"-bit codeword, "k" denotes a natural number and "n" denotes a natural number which is greater than "k".

17 Claims, 16 Drawing Sheets

FIG. 4

| ITERATIVE OPERATION STEPS (CLOCK CYCLE) | BIT VALUES OF INPUTTED ORIGINAL DATA | LFSR (311) | LFSR (312) | LFSR (313) | LFSR (314) | LFSR (315) | LFSR (316) | LFSR (317) | LFSR (318) | FEEDBACK DATA |
|---|---|---|---|---|---|---|---|---|---|---|
| STEP 1 | 0 | 0 | 0 | 0 | 0 | 0 | 0 | 0 | 0 | 0 |
| STEP 2 | 1 | 0 | 0 | 0 | 0 | 0 | 0 | 0 | 0 | 0 |
| STEP 3 | 1 | 1 | 1 | 1 | 0 | 1 | 0 | 0 | 0 | 1 |
| STEP 4 | 0 | 1 | 0 | 0 | 1 | 1 | 1 | 0 | 0 | 1 |
| STEP 5 | 1 | 0 | 1 | 0 | 0 | 1 | 1 | 1 | 0 | 0 |
| STEP 6 | 0 | 1 | 1 | 0 | 0 | 1 | 1 | 1 | 1 | 1 |
| STEP 7 | 1 | 1 | 0 | 0 | 0 | 1 | 1 | 1 | 1 | 1 |
|  |  | 0 | 1 | 0 | 0 | 0 | 1 | 1 | 1 | 0 |

FIG.5

| BIT POSITION | FIRST BIT (MSB) | SECOND BIT | THIRD BIT | FOURTH BIT | FIFTH BIT | SIXTH BIT | SEVENTH BIT (LSB) |
|---|---|---|---|---|---|---|---|
| ARBITRARY VARIABLE | G00 | F00 | E00 | D00 | C00 | B00 | A00 |
| EXAMPLE | 1 | 0 | 1 | 0 | 1 | 1 | 0 |

FIG.6

| LFSR | XOR-EQUATION |
|---|---|
| LFSR(311) | 0 |
| LFSR(312) | 0 |
| LFSR(313) | 0 |
| LFSR(314) | 0 |
| LFSR(315) | 0 |
| LFSR(316) | 0 |
| LFSR(317) | 0 |
| LFSR(318) | 0 |

FIG.7

| LFSR | XOR-EQUATION (FEEDBACK DATUM=0⊕A00=A00) |
|---|---|
| LFSR(311) | A00 |
| LFSR(312) | A00 |
| LFSR(313) | A00 |
| LFSR(314) | 0 |
| LFSR(315) | A00 |
| LFSR(316) | 0 |
| LFSR(317) | 0 |
| LFSR(318) | 0 |

FIG.8

| LFSR | XOR-EQUATION (FEEDBACK DATUM=0⊕B00=B00) |
|---|---|
| LFSR(311) | B00 |
| LFSR(312) | A00 ⊕ B00 |
| LFSR(313) | A00 ⊕ B00 |
| LFSR(314) | A00 |
| LFSR(315) | 0 ⊕ B00 = B00 |
| LFSR(316) | A00 |
| LFSR(317) | 0 |
| LFSR(318) | 0 |

FIG.9

| LFSR | XOR-EQUATION (FEEDBACK DATUM=0⊕C00=C00) |
|---|---|
| LFSR(311) | C00 |
| LFSR(312) | B00 ⊕ C00 |
| LFSR(313) | A00 ⊕ B00 ⊕ C00 |
| LFSR(314) | A00 ⊕ B00 |
| LFSR(315) | A00 ⊕ C00 |
| LFSR(316) | B00 |
| LFSR(317) | A00 |
| LFSR(318) | 0 |

FIG.10

| LFSR | XOR-EQUATION (FEEDBACK DATUM=0⊕D00=D00) |
|---|---|
| LFSR(311) | D00 |
| LFSR(312) | C00 ⊕ D00 |
| LFSR(313) | B00 ⊕ C00 ⊕ D00 |
| LFSR(314) | A00 ⊕ B00 ⊕ C00 |
| LFSR(315) | A00 ⊕ B00 ⊕ D00 |
| LFSR(316) | A00 ⊕ C00 |
| LFSR(317) | B00 |
| LFSR(318) | A00 |

FIG.11

| LFSR | XOR-EQUATION (FEEDBACK DATUM=A00⊕E00) |
|---|---|
| LFSR(311) | A00 ⊕ E00 |
| LFSR(312) | D00 ⊕ A00 ⊕ E00 |
| LFSR(313) | C00 ⊕ D00 ⊕ A00 ⊕ E00 |
| LFSR(314) | B00 ⊕ C00 ⊕ D00 |
| LFSR(315) | A00 ⊕ B00 ⊕ C00 ⊕ A00 ⊕ E00 |
| LFSR(316) | A00 ⊕ B00 ⊕ D00 |
| LFSR(317) | A00 ⊕ C00 |
| LFSR(318) | B00 |

FIG.12

| LFSR | XOR-EQUATION (FEEDBACK DATUM=B00⊕F00) |
|---|---|
| LFSR(311) | B00 ⊕ F00 |
| LFSR(312) | A00 ⊕ E00 ⊕ B00 ⊕ F00 |
| LFSR(313) | D00 ⊕ A00 ⊕ E00 ⊕ B00 ⊕ F00 |
| LFSR(314) | C00 ⊕ D00 ⊕ A00 ⊕ E00 |
| LFSR(315) | B00 ⊕ C00 ⊕ D00 ⊕ B00 ⊕ F00 |
| LFSR(316) | A00 ⊕ B00 ⊕ C00 ⊕ A00 ⊕ E00 |
| LFSR(317) | A00 ⊕ B00 ⊕ D00 |
| LFSR(318) | A00 ⊕ C00 |

FIG.13

| LFSR | XOR-EQUATION (FEEDBACK DATUM=A00⊕C00⊕G00) |
|---|---|
| LFSR(311) | A00 ⊕ C00 ⊕ G00 |
| LFSR(312) | B00 ⊕ F00 ⊕ A00 ⊕ C00 ⊕ G00 |
| LFSR(313) | A00 ⊕ E00 ⊕ B00 ⊕ F00 ⊕ A00 ⊕ C00 ⊕ G00 |
| LFSR(314) | D00 ⊕ A00 ⊕ E00 ⊕ B00 ⊕ F00 |
| LFSR(315) | C00 ⊕ D00 ⊕ A00 ⊕ E00 ⊕ A00 ⊕ C00 ⊕ G00 |
| LFSR(316) | B00 ⊕ C00 ⊕ D00 ⊕ B00 ⊕ F00 |
| LFSR(317) | A00 ⊕ B00 ⊕ C00 ⊕ A00 ⊕ E00 |
| LFSR(318) | A00 ⊕ B00 ⊕ D00 |

FIG.14

| LFSR | XOR-EQUATION | SIMPLIFIED XOR-EQUATIONS WITHOUT DUPLICATE VARIABLES | PARITY BIT VALUES (EXAMPLE) |
|---|---|---|---|
| LFSR(311) | A00 ⊕ C00 ⊕ G00 | A00 ⊕ C00 ⊕ G00 | 0 ⊕ 1 ⊕ 1 = 0 |
| LFSR(312) | B00 ⊕ F00 ⊕ A00 ⊕ C00 ⊕ G00 | B00 ⊕ F00 ⊕ A00 ⊕ C00 ⊕ G00 | 1 ⊕ 0 ⊕ 0 ⊕ 1 ⊕ 1 = 1 |
| LFSR(313) | A00 ⊕ E00 ⊕ B00 ⊕ F00 ⊕ A00 ⊕ C00 ⊕ G00 | E00 ⊕ B00 ⊕ F00 ⊕ C00 ⊕ G00 | 1 ⊕ 1 ⊕ 0 ⊕ 1 ⊕ 1 = 0 |
| LFSR(314) | D00 ⊕ A00 ⊕ E00 ⊕ B00 ⊕ F00 | D00 ⊕ A00 ⊕ E00 ⊕ B00 ⊕ F00 | 0 ⊕ 0 ⊕ 1 ⊕ 1 ⊕ 0 = 0 |
| LFSR(315) | C00 ⊕ D00 ⊕ A00 ⊕ E00 ⊕ A00 ⊕ G00 | D00 ⊕ E00 ⊕ G00 | 0 ⊕ 1 ⊕ 1 = 0 |
| LFSR(316) | B00 ⊕ C00 ⊕ D00 ⊕ B00 ⊕ F00 | C00 ⊕ D00 ⊕ F00 | 1 ⊕ 0 ⊕ 0 = 1 |
| LFSR(317) | A00 ⊕ B00 ⊕ C00 ⊕ A00 ⊕ E00 | B00 ⊕ C00 ⊕ E00 | 1 ⊕ 0 ⊕ 1 = 1 |
| LFSR(318) | A00 ⊕ B00 ⊕ D00 | A00 ⊕ B00 ⊕ D00 | 0 ⊕ 1 ⊕ 0 = 1 |

ERROR CORRECTION CODE (ECC) ENCODERS, ECC ENCODING METHODS CAPABLE OF ENCODING FOR ONE CLOCK CYCLE, AND MEMORY CONTROLLERS INCLUDING THE ECC ENCODERS

CROSS-REFERENCE TO RELATED APPLICATION

The present application claims priority under 35 U.S.C 119(a) to Korean Application No. 10-2016-0158369, filed on Nov. 25, 2016, which is herein incorporated by references in its entirety.

BACKGROUND

1. Technical Field

Various embodiments of the present disclosure relate to an error correction code (ECC) encoder, an ECC encoding method performed in one clock cycle, and a memory controller including the ECC encoder.

2. Related Art

Nonvolatile memory devices retain their stored data even when their power supplies are interrupted. Data storage units including one or more nonvolatile memory devices are widely used in portable systems such as smart phones, digital cameras or computers. Nonvolatile memory devices, particularly, NAND-type flash memory devices have been developed using multi-level cell (MLC) techniques and advanced manufacturing techniques to increase their integration density. Employing MLC techniques increases the number of data bits that can be stored in a single cell, whereas advanced manufacturing techniques can reduce the minimum feature size of patterns constituting memory cells of semiconductor devices. Recently, three-dimensional, vertical cell structures have been developed to overcome the limitation of planar-type memory cell array structures, in which memory cells are two dimensionally arrayed, and to further increase the integration density of NAND-type flash memory devices.

Increasing the number of data bits that can be stored in a limited area may lead to degradation of the reliability of the NAND-type flash memory devices due to cell-to-cell interference resulting in data errors. Accordingly, various ECC schemes have been developed to guarantee the reliability of the semiconductor devices.

In case of nonvolatile memory devices such as phase change random access memory (PCRAM) devices, magneto-resistive RAM (MRAM) devices, nano-floating gate memory (NFGM) devices, resistive RAM (RRAM) devices, polymer RAM devices and so forth, a read margin for recognizing a difference between a datum "0" and a datum "1" may be relatively narrow due to the nature of the memory cells thereof. Thus, the nonvolatile memory devices including the PCRAM devices, the MRAM device, the NFGM devices, the RRAM devices and the polymer RAM devices may exhibit a relatively higher error rate as compared with NAND-type flash memory devices even though a single level cell (SLC) structure is employed therein.

Accordingly, it may be even more necessary to employ an ECC scheme in nonvolatile memory devices including the PCRAM devices, the MRAM device, the NFGM devices, the RRAM devices and the polymer RAM devices. If the semiconductor devices employing the ECC scheme exhibit a relatively low error rate, a Hamming code may be used to detect and correct the data errors. In contrast, if the semiconductor devices employing the ECC scheme exhibit a relatively high error rate, a Bose-Chaudhuri-Hocquenghem (BCH) code or a Reed-Solomon (RS) code may be used to detect and correct the data errors. A binary BCH code may be designed to have a high code rate and may be realized using a relatively simple circuit, as compared with the RS code.

SUMMARY

Various embodiments of the present disclosure are directed to an ECC encoder, an ECC encoding method performed in one clock cycle, and a memory controller including the ECC encoder.

According to an embodiment, an ECC encoder includes a plurality of exclusive OR (XOR) gates configured to receive a "k"-bit original data in parallel and configured to perform a plurality of XOR operations of the "k"-bit original data to output a "(n−k)"-bit parity data. The "k"-bit original data and the "(n−k)"-bit parity data form an "n"-bit codeword, "k" denotes a natural number and "n" denotes a natural number which is greater than "k".

According to another embodiment, there is provided a memory controller. The memory controller includes an error correction code (ECC) encoder and an ECC encoder. The ECC encoder performs an ECC encoding operation to "k"-bit original data, which are to be written into a memory device, to generate an "n"-bit codeword including the original data and corresponding parity bits. The ECC decoder performs an ECC decoding operation to the codeword read from the memory device. The ECC encoder includes a plurality of exclusive OR (XOR) gates configured to receive a "k"-bit original data in parallel and perform a plurality of XOR operations to the "k"-bit original data to output a "(n−k)"-bit parity. The "k"-bit original data and the "(n−k)"-bit parity data form an "n"-bit codeword, "k" denotes a natural number and "n" denotes a natural number which is greater than "k".

According to another embodiment, there is provided an ECC encoding method performed for one clock cycle. The ECC encoding method includes extracting exclusive OR (XOR) equations, each of which is expressed by only XOR operations of arbitrary variables to obtain any one of bit data of a parity included in a codeword. An encoder including a plurality of XOR gates is realized to execute the XOR equations. Bit data of "k"-bit original data are inputted in parallel to the encoder to output the bit data of the parity, which are generated by the plurality of XOR gates, in parallel.

BRIEF DESCRIPTION OF THE DRAWINGS

Various embodiments of the present disclosure will become more apparent in view of the following detailed description in reference with the accompanying, in which:

FIG. 4 is a table illustrating an ECC encoding operation performed by the operation logic circuit of FIG. 3;

FIG. 5 is a table illustrating a method of allocating arbitrary variables to bits included in original data during a process for deducing an equation of an exclusive OR operation performed to establish a logic circuit of an ECC encoder, according to an embodiment of the present disclosure;

FIGS. 6 to 13 are tables illustrating the ECC encoding operation to the original data with the arbitrary variables through the iterative operation logic of FIG. 3;

FIG. 14 is a relationship table between the iterative operation logic of FIG. 3 and simplified logic for the ECC encoding operation according to an embodiment of the present disclosure;

DETAILED DESCRIPTION OF THE EMBODIMENTS

Exemplary embodiments will be described in more detail with reference to the accompanying drawings. The present disclosure, however, may be embodied in various different forms, and should not be construed as being limited to the illustrated embodiments herein. Rather, these embodiments are provided as examples so that this disclosure will be thorough and complete, and will fully convey the various aspects and features of the present invention to those skilled in the art.

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

In the following description, numerous specific details are set forth its order to provide a thorough understanding of the present invention. The present invention may be practiced without some or all of these specific details. In other instances, well-known processes and/or structures have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

Figure 1:
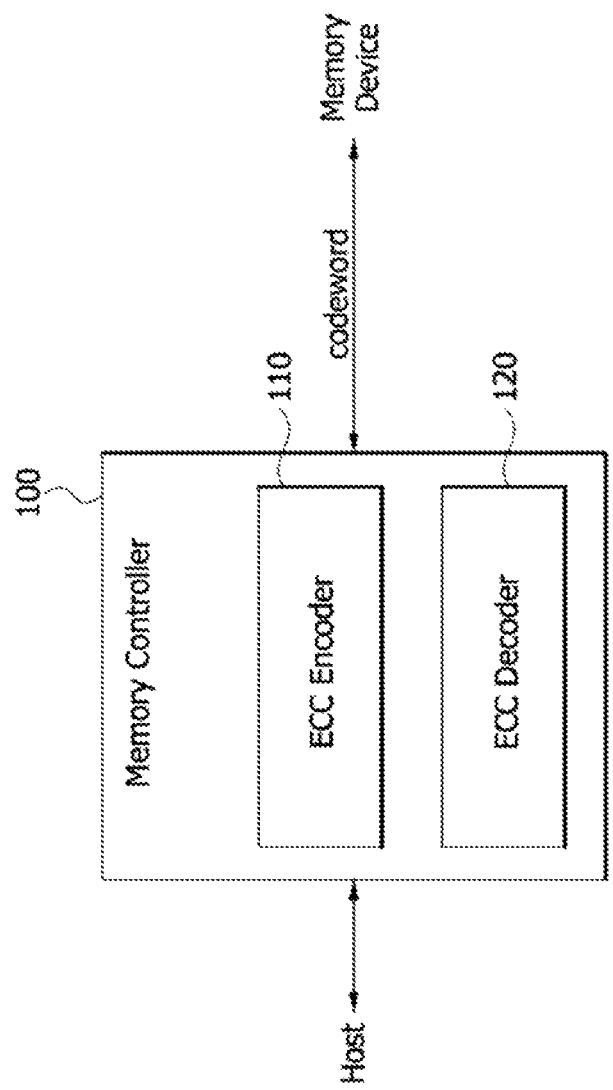
FIG. 1 is a block diagram illustrating a memory controller, according to an embodiment of the present disclosure.

FIG. 1 is a block diagram illustrating a memory controller 100 according to an embodiment of the present disclosure.

Referring to FIG. 1, the memory controller 100 may act as an interface between a host and a memory device and may access to the memory device to control operations of the memory device in response to a request provided from the host. In general, the host may correspond to an upstream part of a system that transmits data to the memory controller 100 and/or receives data from the memory controller 100. The memory device may be a general memory device such as a NAND-type flash memory device or a new memory device such as a PCRAM device, a MRAM device, an NFGM device, an RRAM device or a polymer RAM device. The memory controller 100 may include an ECC encoder 110 and an ECC decoder 120. The ECC encoder 110 may perform an ECC encoding operation to original data, which are to be written into the memory device, to generate a codeword including the original data and panty bits. The ECC decoder 120 may perform an ECC decoding operation to the codeword read from the memory device to restore the original data. The memory controller 100 may transmit the restored or error-corrected original data original data to the host.

Figure 2:
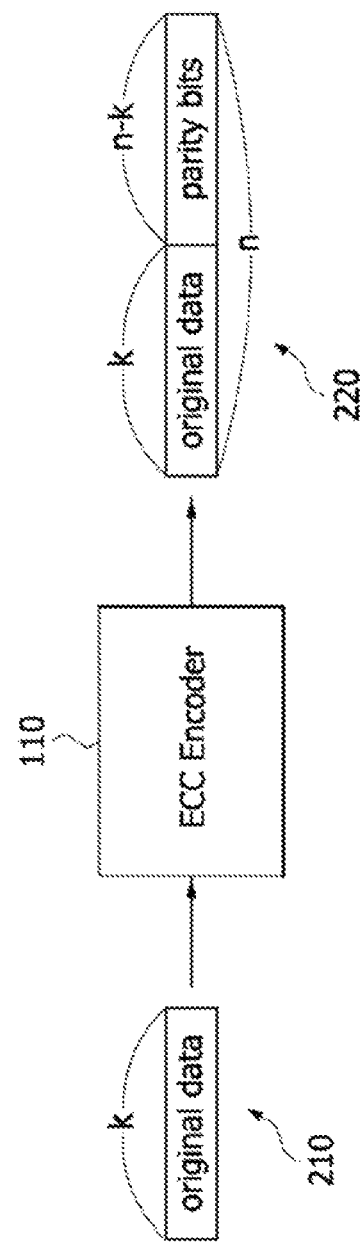
FIG. 2 illustrates an ECC encoder of the memory controller of FIG. 1, together with input and output data of the ECC encoder, according to an embodiment of the present disclosure.

FIG. 2 is a schematic view illustrating the ECC encoder 110 of FIG. 1 together with input data and output data of the ECC encoder 110. Referring to FIG. 2, the ECC encoder 110 may receive "k"-bit original data 210 from the host (where, "k" denotes a natural number). The ECC encoder 110 may receive all of the bit values of the original data 210 in parallel. Although not shown in FIG. 1 or 2, the memory controller 100 may be configured to include a host interface which is realized using a logic circuit appropriate for parallel data transmission so that the ECC encoder 110 receives all of bit values of the original data 210 in parallel. The ECC encoder 110 may perform an ECC encoding operation to the "k"-bit original data 210 to generate and output an "n"-bit codeword 220 (where, "n" denotes a natural number greater than "k"). The ECC encoding operation may be performed using a BCH code. The "n"-bit codeword 220 outputted from the ECC encoder 110 may include the "k"-bit original data 210 and a "(n−k)" parity bits. The "n"-bit codeword 220 may also be outputted in parallel from the ECC encoder 110. Although not shown in FIG. 1 or 2, the memory controller 100 may be configured to include a memory interface which is realized using a logic circuit appropriate for parallel data transmission so that the ECC encoder 110 outputs all of bit values of the "n"-bit codeword 220 in parallel.

The ECC encoder 110 may be realized using a logic circuit including exclusive OR (XOR) arithmetic elements (e.g., XOR gates). According to an embodiment of the present disclosure, the ECC encoding operation may be performed by XOR operations using linear feedback shift registers (LFSRs).

Figure 3:
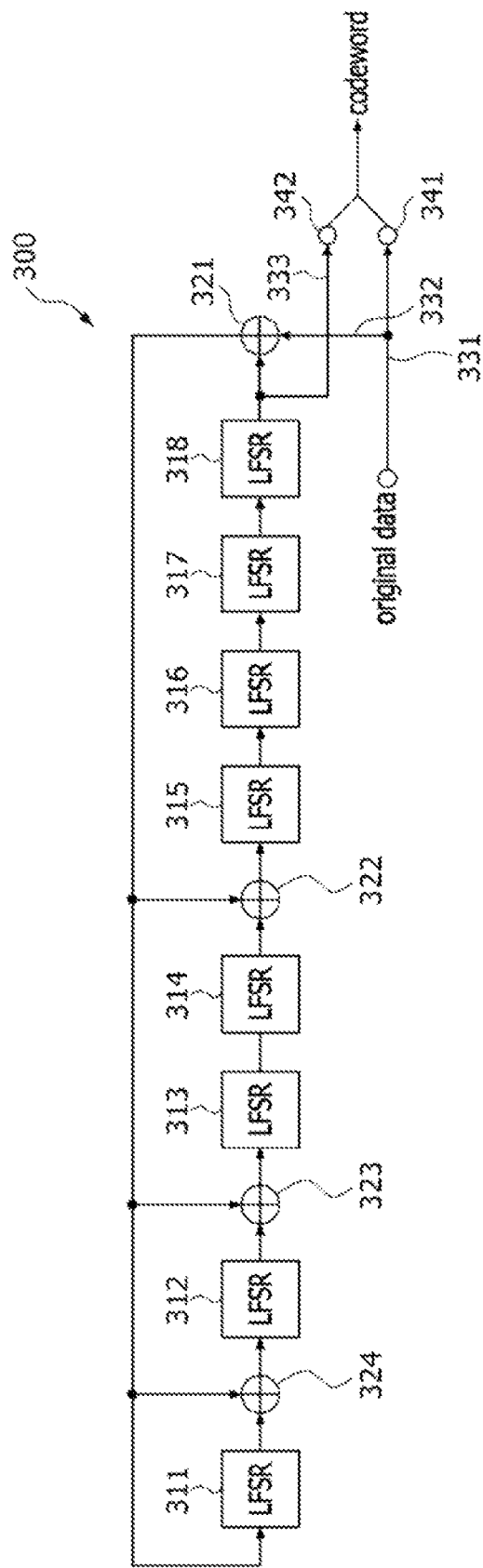
FIG. 3 is an operation logic circuit diagram illustrating an iterative operation logic for an ECC encoding operation according to an embodiment of the present disclosure.

FIG. 3 is a logic diagram illustrating an iterative operation logic for the ECC encoding operation of the ECC encoder 110 according to an embodiment of the present disclosure, and shows the iterative operation logic as an iterative operation logic circuit 300.

Referring to FIG. 3, the iterative operation logic circuit 300 may perform an iterative XOR operation with a plurality of LFSRs and a plurality of XOR arithmetic elements to ECC-encode the original data. The iterative operation logic circuit 300 may receive the "k"-bit original data and may generate and output the "n"-bit codeword as a result of the ECC encoding operation. Hereinafter, it is assumed as an example that the number "k" of bits included in the original data is seven. However, the iterative operation logic circuit 300 of FIG. 3 is merely an example of suitable iterative operation logic circuits. That is, the number "k" of bits included in the original data may be less than or greater than seven according to various embodiments. The number "n" of bits included in the codeword may be equal to "$2^m-1$" (i.e., $n=2^m-1$) where, 'm' is a positive integer which is equal to or greater than three and the number "(n−k)" of bits included in the parity necessary for error correction may be equal to or less than "m×t" (i.e., (n−k)≤m×t)) where, 't' is error correction capability)". For example, the error correction capability represents a maximum number of error-correctable bits. The number of the LFSRs may be "(n−k)" in the iterative operation logic circuit 300.

Since the number "k" of bits included in the original data is seven as an example, the minimum value of the number "m" may be four because the number "n" of bits include in the codeword should be greater than seven (refer to the equation "$n=2^m-1$"). In such a case, the number "n" of bits include in the codeword may be fifteen. In addition, if the error correction capability "t" is two, the number "(n−k)" of bits included in the parity necessary for error correction should be eight. If the number "k" of bits included in the original data is seven and the number "n" of bits include in the codeword including the parity bits (i.e., 8 bits) is fifteen, the iterative operation logic circuit 300 may include eight linear feedback shift registers (LFSRs) (i.e., first to eighth LFSRs 311 to 318) and four XOR arithmetic elements (i.e., first to fourth XOR arithmetic elements 321 to 324).

Specifically, the first LFSR 311 may receive feedback data outputted from the first XOR arithmetic element 321 and may transmit data stored therein to the fourth XOR arithmetic element 324 in a subsequent step. The fourth XOR arithmetic element 324 may perform an XOR operation to the feedback data outputted from the first XOR arithmetic element 321 and the data outputted from the first LFSR 311 and may output the result of the XOR operation to the second LFSR 312.

The second LFSR 312 may transmit data stored therein to the third XOR arithmetic element 323 in a subsequent step. The third XOR arithmetic element 323 may perform an XOR operation to the feedback data outputted from the first XOR arithmetic element 321 and the data outputted from the second LFSR 312 and may output the result of the XOR operation to the third LFSR 313.

The third LFSR 313 may transmit data stored therein to the fourth LFSR 314 in a subsequent step.

The fourth LFSR 314 may transmit data stored therein to the second XOR arithmetic element 322 in a subsequent step. The second XOR arithmetic element 322 may perform an XOR operation to the feedback data outputted from the first XOR arithmetic element 321 and the data outputted from the fourth LFSR 314 and may output the result of the XOR operation to the fifth LFSR 315.

The fifth LFSR 315 may transmit data stored therein to the sixth LFSR 316 in a subsequent step. The sixth LFSR 316 may transmit data stored therein to the seventh LFSR 317 in a subsequent step. The seventh LFSR 317 may transmit data stored therein to the eighth LFSR 318 in a subsequent step. The eighth LFSR 318 may transmit data stored therein to the first XOR arithmetic element 321 in a subsequent step. The data output from the eighth LFSR 318 may also constitute the parity bits of the codeword.

The data shifting operation of each of the first to eighth LFSRs 311 to 318 may be performed in synchronization with a clock signal, and an XOR operation of each of the first to fourth XOR arithmetic elements 321 to 324 may also be performed in synchronization with the clock signal. The original data inputted to the iterative operation logic circuit 300 may be outputted through a first output terminal 341 of an input/output (I/O) line 331 to constitute a portion of the codeword and may be transmitted to the first test XOR arithmetic element 321 through an input line 332. In some embodiments, the original data may be sequentially inputted bit by bit from a least significant bit LSB to a most significant bit MSB to the iterative operation logic circuit 300. The original data may also be inputted to the iterative operation logic circuit 300 in synchronization with the clock signal.

An output line 333 of the eighth LFSR 318 may be coupled to a second output terminal 342. Output data of the eighth LFSR 318 may be inputted to the first XOR arithmetic element 321 while the iteration operation of the iterative operation logic circuit 300 is performed and may be outputted through the second output terminal 342 after each iteration operation of the iterative operation logic circuit 300. In such a case, the data stored in the first to eighth LFSRs 311 to 318 may be sequentially outputted through the second output terminal 342 to constitute the parity bits of the codeword.

FIG. 4 is a table illustrating the ECC encoding operation through the iterative operation logic represented by the iterative operation logic circuit 300. Hereinafter, it is assumed as an example that the original data has a binary value of '1010110'.

Referring to FIGS. 3 and 4, in an initial step, all of the first to eighth LFSRs 311 to 318 may be set to have values of "0(zero)" and the feedback datum outputted from the first XOR arithmetic element 321 may also be set to have a value of "0(zero)".

In a first step executed during a first clock cycle, a datum "0" of the seventh bit (i.e., the LSB) of the original data may be inputted to the iterative operation logic circuit 300, and the input datum "0" may be outputted through the first output terminal 341 of the I/O line 331 and may also be inputted to the first XOR arithmetic element 321 through the input line 332. The first XOR arithmetic element 321 may perform an XOR operation to the datum "0" or the seventh bit value of the original data through the input line 332 and the datum "0" outputted from the eighth LFSR 318 to output a datum "0" as the feedback datum. The feedback datum "0" may then be inputted to all of the second to fourth XOR arithmetic elements 322, 323 and 324 and may also be stored into the first LFSR 311.

In a second step executed during a second clock cycle a datum "1" of the sixth bit of the original data may be inputted to the iterative operation logic circuit 300, and the input datum "1" may be outputted through the first output terminal 341 of the I/O line 331 and may also be inputted to the first XOR arithmetic element 321 through the input line 332. The first XOR arithmetic element 321 may then perform an XOR operation to the datum "1" (i.e., the sixth bit value of the original data) inputted through the input line 332 and the datum "0" outputted from the eighth LFSR 318 to output a datum "1" as the feedback datum. The feedback datum "1" may then be inputted to all of the second to fourth. XOR arithmetic elements 322, 323 and 324 and may also be stored into the first LFSR 311. The fourth XOR arithmetic element 324 may perform an XOR operation to the previous datum "0" stored in the first LFSR 311 and the feedback datum "1" outputted from the first. XOR arithmetic element 321 to output a datum "1", and the output datum "1" of the fourth XOR arithmetic element 324 may be stored into the second LFSR 312. The third XOR arithmetic element 323 may then perform an XOR operation to the previous datum "0" stored in the second LFSR 312 and the feedback datum "1" outputted from the first XOR arithmetic element 321 to output a datum "1", and the output datum "1" of the third XOR arithmetic element 323 may be stored into the third LFSR 313. The previous datum "0" stored in the third LFSR 313 may be transmitted to the fourth LFSR 314. The second XOR arithmetic element 322 may perform an XOR operation to the previous datum "0" stored in the fourth LFSR 314 and the feedback datum "1" outputted from the first XOR arithmetic element 321 to output a datum "1", and the output datum "1" of the second XOR arithmetic element 322 may be stored into the fifth LFSR 315.

In a third step executed during a third clock cycle, a datum "1" of the fifth bit of the original data may be inputted to the iterative operation logic circuit 300, and the input datum "1" may be outputted through the first output terminal 341 of the I/O line 331 as a portion of the codeword and may also be inputted to the first XOR arithmetic element 321 through the input line 332. The first XOR arithmetic element 321 may perform an XOR operation to the datum "1" (i.e., the fifth bit value of the original data) inputted through the input line 332 and the datum "0" outputted from the eighth LFSR 318 to output a datum "1" as the feedback datum. The feedback datum "1" may be inputted to all of the second to fourth XOR arithmetic elements 322, 323, and 324 and may be stored into the first LFSR 311. The fourth XOR arithmetic element 324 may perform an XOR operation to the previous datum "1" stored in the first LFSR 311 and the feedback datum "1" outputted from the first XOR arithmetic element 321 to output a datum "0", and the output datum "1" of the fourth XOR arithmetic element 324 may be stored into the second LFSR 312. The third XOR arithmetic element 323 may perform an XOR operation to the previous datum stored in the second LFSR 312 and the feedback datum "1" outputted from the first XOR arithmetic element 321 to output a datum "0", and the output datum "0" of the third XOR arithmetic element 323 may be stored into the third LFSR 313. The previous datum "1" stored in the third LFSR 313 may be transmitted to the fourth LFSR 314. The second XOR arithmetic element 322 may perform an XOR operation to the previous datum "0" stored in the fourth LFSR 314 and the feedback datum "1" outputted from the first XOR arithmetic element 321 to output a datum "1", and the output datum"1" of the second XOR arithmetic element 322 may be stored into the fifth LFSR 315. The previous datum "1" stored in the fifth LFSR 315 may be transmitted to the sixth LFSR 316.

In a fourth step executed during a fourth clock cycle, a datum "0" of the fourth bit of the original data may be inputted to the iterative operation logic circuit 300, and the input datum "0" may be outputted through the first output terminal 341 of the I/O line 331 as a portion of the codeword and may also be inputted to the first test XOR arithmetic element 321 through the input line 332. The first XOR arithmetic element 321 may perform an XOR operation to the datum "0" (i.e., the fourth bit value of the original data) inputted through the input line 332 and the datum "0" outputted from the eighth LFSR 318 to output a datum "0" as the feedback datum. The feedback datum "0" may be inputted to all of the second to fourth XOR arithmetic elements 322~324 and may be stored into the first LFSR 311. The fourth XOR arithmetic element 324 may perform an XOR operation to the previous datum "1" stored in the first LFSR 311 and the feedback datum "0" outputted from the first XOR arithmetic element 321 to output a datum "1", and the output datum "1" of the fourth XOR arithmetic element 324 may be stored into the second LFSR 312. The third XOR arithmetic element 323 may perform an XOR operation to the previous datum "0" stored in the second LFSR 312 and the feedback datum "0" outputted from the first XOR arithmetic element 321 to output a datum "0", and the output datum "0" of the third XOR arithmetic element 323 may be stored into the third LFSR 313. The previous datum "0" stored in the third LFSR 313 may be transmitted to the fourth LFSR 314. The second XOR arithmetic element 322 may perform an XOR operation to the previous datum "1" stored in the fourth LFSR 314 and the feedback datum "0" outputted from the first XOR arithmetic element 321 to output a datum "1", and the output datum "1" of the second XOR arithmetic element 322 may be stored into the fifth LFSR 315. The previous datum "1" stored in the fifth LFSR 315 may be transmitted to the sixth LFSR 316. The previous datum "1" stored in the sixth LFSR 316 may be transmitted to the seventh LFSR 317.

In a fifth step executed during a fifth clock cycle, a datum "1" of the third bit of the original data may be inputted to the iterative operation logic circuit 300, and the input datum "1" may be outputted through the first output terminal 341 of the I/O line 331 as a portion of the codeword and may also be inputted to the first XOR arithmetic element 321 through the input line 332. The first XOR arithmetic element 321 may perform an XOR operation to the datum "1" (or the third bit value of the original data) inputted through the input line 332 and the datum "0" outputted from the eighth LFSR 318 to output a datum "1" as the feedback datum. The feedback datum "1" may be inputted to all of the second to fourth XOR arithmetic elements 322~324 and may be stored into the first LFSR 311. The fourth XOR arithmetic element 324 may perform an XOR operation to the previous datum "0" stored in the first LFSR 311 and the feedback datum "1" outputted from the first XOR arithmetic element 321 to output a datum "1", and the output datum "1" of the fourth XOR arithmetic element 324 may be stored into the second LFSR 312. The third XOR arithmetic element 323 may perform an XOR operation to the previous datum "1" stored in the second LFSR 312 and the feedback datum "1" outputted from the first. XOR arithmetic element 321 to output a datum "0", and the output datum "0" of the third XOR arithmetic element 323 may be stored into the third LFSR 313. The previous datum "0" stored in the third LFSR 313 may be transmitted to the fourth LFSR 314. The second XOR arithmetic element 322 may perform an XOR operation to the previous datum "0" stored in the fourth LFSR 314 and the feedback datum "1" outputted from the first XOR arithmetic element 321 to output a datum "1", and the output datum "1" of the second XOR arithmetic element 322 may be stored into the fifth LFSR 315. The previous datum "1" stored in the fifth LFSR 315 may be transmitted to the sixth LFSR 316. The previous datum "1" stored in the sixth LFSR 316 may be transmitted to the seventh LFSR 317. The previous datum "1" stored in the seventh LFSR 317 may be transmitted to the eighth LFSR 318.

In a sixth step executed during a sixth clock cycle, a datum "0" of the second bit of the original data may be inputted to the iterative operation logic circuit 300, and the input datum "0" may be outputted through the first output terminal 341 of the I/O line 331 as a portion of the codeword and may also be inputted to the first XOR arithmetic element 321 through the input line 332. The first XOR arithmetic element 321 may perform an XOR operation to the datum "0" (or the second bit value of the original data) inputted through the input line 332 and the datum "1" outputted from the eighth LFSR 318 to output a datum "1" as the feedback datum. The feedback datum may be inputted to all of the second to fourth XOR arithmetic elements 322~324 and may be stored into the first LFSR 311. The fourth XOR arithmetic element 324 may perform an XOR operation to the previous datum "1" stored in the first LFSR 311 and the feedback datum "1" outputted from the first XOR arithmetic element 321 to output a datum "0", and the output datum "0" of the fourth XOR arithmetic element 324 may be stored into the second LFSR 312. The third XOR arithmetic element 323 may perform an XOR operation to the previous datum "1" stored in the second LFSR 312 and the feedback datum "1" outputted from the first XOR arithmetic element 321 to output a datum "0", and the output datum "0" of the third XOR arithmetic element 323 may be stored into the third LFSR 313. The previous datum "0" stored in the third LFSR 313 may be transmitted to the fourth LFSR 314. The second XOR arithmetic element 322 may perform an XOR operation to the previous datum "0" stored in the fourth LFSR 314 and the feedback datum "1" outputted from the first XOR arithmetic element 321 to output a datum "1", and the output datum "1" of the second XOR arithmetic element 322 may be stored into the fifth. LFSR 315. The previous datum "1" stored in the fifth LFSR 315 may be transmitted to the sixth LFSR 316. The previous datum "1" stored in the sixth LFSR 316 may be transmitted to the seventh LFSR 317. The previous datum "1" stored in the seventh LFSR 317 may be transmitted to the eighth LFSR 318.

In a seventh step executed during a seventh clock cycle, a datum "1" of the first bit (i.e., the MSB) of the original data may be inputted to the iterative operation logic circuit 300, and the input datum "1" may be outputted through the first output terminal 341 of the I/O line 331 as a portion of the codeword and may also be inputted to the first test XOR arithmetic element 321 through the input line 332. The first XOR arithmetic element 321 may perform an XOR operation to the datum "1" (or the first bit value of the original data) inputted through the input line 332 and the datum "1" outputted from the eighth LFSR 318 to output a datum "0" as the feedback datum. The feedback datum "0" may be inputted to all of the second to fourth XOR arithmetic elements 322~324 and may be stored into the first LFSR 311. The fourth XOR arithmetic element 324 may perform an XOR operation to the previous datum "1" stored in the first LFSR 311 and the feedback datum "0" outputted from the first XOR arithmetic element 321 to output a datum "1", and the output datum "1" of the fourth XOR arithmetic element 324 may be stored into the second LFSR 312. The third XOR arithmetic element 323 may perform an XOR operation to the previous datum "0" stored in the second LFSR 312 and the feedback datum "0" outputted from the first XOR arithmetic element 321 to output a datum "0", and the output datum "0" of the third XOR arithmetic element 323 may be stored into the third LFSR 313. The previous datum "0" stored in the third LFSR 313 may be transmitted to the fourth LFSR 314. The second XOR arithmetic element 322 may perform an XOR operation to the previous datum "0" stored in the fourth LFSR 314 and the feedback datum "0" outputted from the first XOR arithmetic element 321 to output a datum "0", and the output datum "0" of the second XOR arithmetic element 322 may be stored into the fifth LFSR 315. The previous datum "1" stored in the fifth LFSR 315 may be transmitted to the sixth LFSR 316. The previous datum "1" stored in the sixth LFSR 316 may be transmitted to the seventh LFSR 317. The previous datum "1" stored in the seventh LFSR 317 may be transmitted to the eighth LFSR 318.

As described above, as a result of the iterative operation performed for seven clock cycles to ECC-encode the original data of '1010110', data of '01000111' may be stored into the first to eighth LFSRs 311 to 318. The data '01000111' may be sequentially outputted from the iterative operation logic circuit 300 through the output line 333 and the second output terminal 342 to constitute the parity bits of the codeword. Thus, the iterative operation logic circuit 300 may receive the 7-bit original data of '1010110' and may output the 15-bit codeword of '101011001000111' including the 7-bit original data (i.e., '1010110') and the 8-bit parity (i.e., '01000111'). The iterative operation for the ECC encoding may be performed for seven dock cycles if the number of bits included in the original data is seven. That is, if the number of bits included in the original data is "k", "k"-number of clock cycles may be required for the ECC encoding of the "k"-bit original data.

FIG. 5 shows an example of the original data to which arbitrary variables are allocated.

Referring to FIG. 5, the arbitrary variables may be allocated to the bits included in the 7-bit original data, respectively. For example, an arbitrary variable "A00" may be allocated to the seventh bit (i.e., the LSB) of the 7-bit original data. An arbitrary variable "B00" may be allocated to the sixth bit of the 7-bit original data. An arbitrary variable "C00" may be allocated to the fifth bit of the 7-bit original data. An arbitrary variable "D00" may be allocated to the fourth bit of the 7-bit original data. An arbitrary variable "E00" may be allocated to the third bit of the 7-bit original data. An arbitrary variable "F00" may be allocated to the second bit of the 7-bit original data. An arbitrary variable "G00" may be allocated to the first bit (i.e., the MSB) of the 7-bit original data. Each of the arbitrary variables "A00, B00, C00, D00, E00, F00 and G00" allocated to the bits of the 7-bit original data may represent a datum "0" or a datum "1" If the 7-bit original data have a combination of '1010110', the arbitrary variables "A00, B00, C00, D00 E00, F00 and G00" may respectively have a datum "0", a datum "1", a datum "1", a datum "0", a datum "1", a datum "0" and a datum "1".

FIGS. 6 to 13 are tables illustrating the ECC encoding operation to the original data with the arbitrary variables through the iterative operation logic of FIG. 3.

The iterative operation of the iterative operation logic circuit 300 may perform the ECC encoding operation to the original data with the arbitrary variables "A00, B00, C00, D00, E00, F00 and G00".

First, as illustrated in FIG. 6, the first to eighth LFSRs 311 to 318 of the iterative operation logic circuit 300 for the ECC encoding may be initialized to have data "0". In such a case, the feedback datum outputted from the first XOR arithmetic element 321 may also be set to have a logic "0".

Next, as illustrated in FIG. 7, the first step may be executed during the first clock cycle. Specifically, the arbitrary variable "A00" allocated to the seventh bit (i.e., the LSB) of the original data may be inputted to the iterative operation logic circuit 300, and the input datum "A00" may be outputted as a portion of the codeword and may also be inputted to the first XOR arithmetic element 321. The first XOR arithmetic element 321 may perform an XOR operation to the datum "A00" or the seventh bit value of the original data and the datum "0" outputted from the eighth LFSR 318 to output the datum "A00" as the feedback datum. The feedback datum "A00" may be inputted to all of the second to fourth XOR arithmetic elements 322~324 and may be stored into the first LFSR 311. The fourth XOR arithmetic element 324 may perform an XOR operation to the previous datum "0" stored in the first LFSR 311 and the feedback datum "A00" outputted from the first XOR arithmetic element 321 to output the datum "A00", and the output datum "A00" of the fourth XOR arithmetic element 324 may be stored into the second LFSR 312. The third XOR arithmetic element 323 may perform an XOR operation to the previous datum "0" stored in the second LFSR 312 and the feedback datum "A00" outputted from the first XOR arithmetic element 321 to output the datum "A00", and the output datum "A00" of the third XOR arithmetic element 323 may be stored into the third LFSR 313. The previous datum "0" stored in the third LFSR 313 may be transmitted to the fourth LFSR 314. The second XOR arithmetic element 322 may perform an XOR operation to the previous datum "0" stored in the fourth LFSR 314 and the feedback datum "A00" outputted from the first XOR arithmetic element 321 to output a datum "A00", and the output datum "A00" of the second XOR arithmetic element 322 may be stored into the fifth LFSR 315. As a result, the data "A00", "A00", "A00", "0", "A00", "0", "0" and "0" may be respectively stored into the first to eighth LFSRs 311 to 318 during the first clock cycle.

Next, as illustrated in FIG. 8, in the second step executed during the second clock cycle, the arbitrary variable "B00" allocated to the sixth bit of the original data may be inputted to the iterative operation logic circuit 300, and the input datum "B00" may be outputted as a portion of the code word and may also be inputted to the first XOR arithmetic element 321. The first XOR arithmetic element 321 may perform an XOR operation to the datum "B00" or the sixth bit value of the original data and the datum "0" outputted from the eighth LFSR 318 to output the datum "B00" as the feedback datum. The feedback datum "B00" may be inputted to all of the second to fourth XOR arithmetic elements 322~324 and may be stored into the first LFSR 311. The fourth XOR arithmetic element 324 may perform an XOR operation to the previous datum "A00" stored in the first LFSR 311 and the feedback datum "B00" outputted from the first XOR arithmetic element 321 to output a datum "A00⊕B00", and the output datum "A00⊕B00" of the fourth XOR arithmetic element 324 may be stored into the second LFSR 312. The third XOR arithmetic element 323 may perform an XOR operation to the previous datum "A00" stored in the second LFSR 312 and the feedback datum "B00" outputted from the first XOR arithmetic element 321 to output a datum "A00⊕B00", and the output datum "A00⊕B00" of the third XOR arithmetic element 323 may be stored into the third LFSR 313. The previous datum "A00" stored in the third LFSR 313 may be transmitted to the fourth. LFSR 314. The second XOR arithmetic element 322 may perform an XOR operation to the previous datum "0" stored in the fourth LFSR 314 and the feedback datum "B00" outputted from the first XOR arithmetic element 321 to output a datum "B00", and the output datum "B00" of the second XOR arithmetic element 322 may be stored into the fifth LFSR 315. The previous datum "A00" stored in the fifth LFSR 315 may be transmitted to the sixth LFSR 316. As a result, the data "B00", "A00⊕B00", "A00⊕B00", "A00", "B00", "A00" "0" and "0" may be respectively stored into the first to eighth LFSRs 311 to 318 during the second clock cycle.

Next, as illustrated in FIG. 9, in the third step executed during the third clock cycle, the arbitrary variable "C00" allocated to the fifth bit of the original data may be inputted to the iterative operation logic circuit 300, and the input datum "C00" may be outputted as a portion of the codeword and may also be inputted to the first XOR arithmetic element 321. The first XOR arithmetic element 321 may perform an XOR operation to the datum "C00" or the fifth bit value of the original data and the datum "0" outputted from the eighth LFSR 318 to output the datum "C00" as the feedback datum. The feedback datum "C00" may be inputted to all of the second to fourth XOR arithmetic elements 322~324 and may be stored into the first LFSR 311. The fourth XOR arithmetic element 324 may perform an XOR operation to the previous datum "B00" stored in the first LFSR 311 and the feedback datum "C00" outputted from the first XOR arithmetic element 321 to output a datum "B00⊕C00", and the output datum "B00⊕C00" of the fourth XOR arithmetic element 324 may be stored into the second LFSR 312. The third XOR arithmetic element 323 may perform an XOR operation to the previous datum "A00⊕B00" stored in the second LFSR 312 and the feedback datum "C00" outputted from the first XOR arithmetic element 321 to output a datum "A00⊕B00⊕C00", and the output datum "A00⊕B00⊕C00" of the third XOR arithmetic element 323 may be stored into the third LFSR 313. The previous datum "A00⊕B00" stored in the third LFSR 313 may be transmitted to the fourth LFSR 314. The second XOR arithmetic element 322 may perform an XOR operation to the previous datum "A00" stored in the fourth LFSR 314 and the feedback datum "C00" outputted from the first XOR arithmetic element 321 to output a datum "A00⊕C00", and the output datum "A00⊕C00" of the second XOR arithmetic element 322 may be stored into the fifth LFSR 315. The previous datum "B00" stored in the fifth LFSR 315 may be transmitted to the sixth LFSR 316. The previous datum "A00" stored in the sixth LFSR 316 may be transmitted to the seventh LFSR 317. As a result, the data "C00", "B00⊕C00", "A00 B00⊕C00", "A00⊕B00", "A00⊕C00", "B00", "A00" and "0" may be respectively stored into the first to eighth LFSRs 311 to 318 during the third clock cycle.

Next, as illustrated in FIG. 10, in the fourth step executed during the fourth clock cycle, the arbitrary variable "D00" allocated to the fourth bit of the original data may be inputted to the iterative operation logic circuit 300, and the input datum "D00" may be outputted as a portion of the codeword and may also be inputted to the first XOR arithmetic element 321. The first XOR arithmetic element 321 may perform an XOR operation to the datum "D00" or the fourth bit value of the original data and the datum "0" outputted from the eighth LFSR 318 to output the datum "D00" as the feedback datum. The feedback datum "D00" may be inputted to all of the second to fourth XOR arithmetic elements 322~324 and may be stored into the first LFSR 311. The fourth XOR arithmetic element 324 may perform an XOR operation to the previous datum "C00" stored in the first LFSR 311 and the feedback datum "D00" outputted from the first XOR arithmetic element 321 to output a datum "C00⊕D00", and the output datum "C00⊕D00" of the fourth XOR arithmetic element 324 may be stored into the second LFSR 312. The third XOR arithmetic element 323 may perform an XOR operation the previous datum "B00⊕C00" stored in the second LFSR 312 and the feedback datum "D00" outputted from the first XOR arithmetic element 321 to output a datum "B00⊕C00⊕D00", and the output datum "B00⊕C00⊕D00" of the third XOR arithmetic element 323 may be stored into the third LFSR 313. The previous datum "A00⊕B00⊕C00" stored in the third LFSR 313 may be transmitted to the fourth LFSR 314. The second XOR arithmetic element 322 may perform an XOR operation to the previous datum "A00⊕B00" stored in the fourth LFSR 314 and the feedback datum "D00" outputted from the first XOR arithmetic element 321 to output a datum "A00⊕B00⊕D00", and the output datum "A00⊕B00⊕D00" of the second XOR arithmetic element 322 may be stored into the fifth LFSR 315. The previous datum "A00⊕C00" stored in the fifth LFSR 315 may be transmitted to the sixth LFSR 316. The previous datum "B00" stored in the sixth LFSR 316 may be transmitted to the seventh LFSR 317. The previous datum "A00" stored in the seventh LFSR 317 may be transmitted to the eighth LFSR 318. As a result, the data "D00", "C00⊕D00", "B00⊕C00⊕D00", "A00⊕B00⊕C00", "A00⊕B00⊕D00", "A00⊕C00", "B00" and "A00" may be respectively stored into the first to eighth LFSRs 311 to 318 during the fourth clock cycle.

Next, as illustrated in FIG. 11, in the fifth step executed during the fifth clock cycle, the arbitrary variable "E00" allocated to the third bit of the original data may be inputted to the iterative operation logic circuit 300, and the input datum "E00" may be outputted as a portion of the codeword and may also be inputted to the first XOR arithmetic element 321. The first XOR arithmetic element 321 may perform an XOR operation to the datum "E00" or the third bit value of the original data and the datum "A00" outputted from the eighth LFSR 318 to output a datum "A00⊕E00" as the feedback datum. The feedback datum "A00⊕E00" may be inputted to all of the second to fourth XOR arithmetic elements 322~324 and may be stored into the first LFSR 311. The fourth XOR arithmetic element 324 may perform an XOR operation to the previous datum "D00" stored in the first LFSR 311 and the feedback datum "A00⊕E00" outputted from the first XOR arithmetic element 321 to output a datum "D00⊕A00⊕E00", and the output datum "D00⊕A00⊕E00" of the fourth XOR arithmetic element 324 may be stored into the second LFSR 312. The third XOR arithmetic element 323 may perform an XOR operation to the previous datum "C00⊕D00" stored in the second LFSR 312 and the feedback datum "A00⊕E00" outputted from the first XOR arithmetic element 321 to output a datum "C00⊕D00⊕A00⊕E00", and the output datum "C00⊕D00⊕A00⊕E00" of the third XOR arithmetic element 323 may be stored into the third LFSR 313. The previous datum "B00⊕C00⊕D00" stored in the third LFSR 313 may be transmitted to the fourth LFSR 314. The second XOR arithmetic element 322 may perform an XOR operation to the previous datum "A00⊕B00⊕C00" stored in the fourth LFSR 314 and the feedback datum "A00⊕E00" outputted from the first XOR arithmetic element 321 to output a datum "A00⊕B00⊕C00⊕A00⊕E00", and the output datum "A00⊕B00⊕C00⊕A00⊕E00" of the second XOR arithmetic element 322 may be stored into the fifth LFSR 315. The previous datum "A00⊕B00⊕D00" stored in the fifth LFSR 315 may be transmitted to the sixth LFSR 316. The previous datum "A00⊕C00" stored in the sixth LFSR 316 may be transmitted to the seventh LFSR 317. The previous datum "B00" stored in the seventh LFSR 317 may be transmitted to the eighth LFSR 318. As a result, the data "A00⊕E00", "D00⊕A00⊕E00", "C00⊕D00⊕A00⊕E00", "B00⊕C00⊕D00", "A00⊕B00⊕C00⊕A00⊕E00", "A00⊕B00⊕D00", "A00⊕C00" and "B00" may be respectively stored into the first to eighth LFSRs 311 to 318 during the fifth dock cycle.

Next, as illustrated in FIG. 12, in the sixth step executed during the sixth clock cycle, the arbitrary variable "F00" allocated to the second bit of the original data may be inputted to the iterative operation logic circuit 300 and the input datum "F00" may be outputted as a portion of the code word and may also be inputted to the first XOR arithmetic element 321. The first XOR arithmetic element 321 may perform an XOR operation to the datum "F00" or the second bit value of the original data and the datum "B00" outputted from the eighth LFSR 318 to output a datum "B00⊕F00" as the feedback datum. The feedback datum "B00⊕F00" may be inputted to all of the second to fourth XOR arithmetic elements 322~324 and may be stored into the first LFSR 311. The fourth XOR arithmetic element 324 may perform an XOR operation to the previous datum "A00⊕E00" stored in the first LFSR 311 and the feedback datum "B00⊕F00" outputted from the first XOR arithmetic element 321 to output a datum "A00⊕E00⊕B00⊕F00", and the output datum "A00⊕E00⊕B00⊕F00" of the fourth XOR arithmetic element 324 may be stored into the second LFSR 312. The third XOR arithmetic element 323 may perform an XOR operation to the previous datum "D00⊕A00⊕E00" stored in the second LFSR 312 and the feedback datum "B00⊕F00" outputted from the first XOR arithmetic element 321 to output a datum "D00⊕A00⊕E00(+)B00⊕F00", and the output datum "D00⊕A00⊕E00⊕B00⊕F00" of the third XOR arithmetic element 323 may be stored into the third LFSR 313. The previous datum "C00⊕D00⊕A00⊕E00" stored in the third LFSR 313 may be transmitted to the fourth LFSR 314. The second XOR arithmetic element 322 may perform an XOR operation to the previous datum "B00⊕C00⊕D00" stored in the fourth LFSR 314 and the feedback datum "B00⊕F00" outputted from the first XOR arithmetic element 321 to output a datum "B00⊕C00⊕D00⊕B00⊕F00", and the output datum "B00⊕C00⊕D00⊕B00⊕F00" of the second XOR arithmetic element 322 may be stored into the fifth LFSR 315. The previous datum "A00⊕B00⊕C00⊕A00⊕E00" stored in the fifth LFSR 315 may be transmitted to the sixth LFSR 316. The previous datum "A00⊕B00⊕D00" stored in the sixth LFSR 316 may be transmitted to the seventh LFSR 317. The previous datum "A00⊕C00" stored in the seventh LFSR 317 may be transmitted to the eighth LFSR 318. As a result, the data "B00⊕F00", "A00⊕E00⊕B00⊕F00", "D00⊕A00⊕E00⊕B00⊕F00", "C00⊕D00⊕A00⊕E00", "B00⊕C00⊕D00⊕B00⊕F00", "A00⊕B00⊕C00⊕A00⊕E00", "A00⊕B00⊕D00" and "A00⊕C00" may be respectively stored into the first to eighth LFSRs 311 to 318 during the sixth clock cycle.

Next, as illustrated in FIG. 13, in the seventh step executed during the seventh clock cycle, the arbitrary variable "G00" allocated to the first bit of the original data may be inputted to the iterative operation logic circuit 300, and the input datum "G00" may be outputted as a portion of the codeword and may also be inputted to the first XOR arithmetic element 321. The first XOR arithmetic element 321 may perform an XOR operation to the datum "G00" or the first bit value of the original data and the datum "A00⊕C00" outputted from the eighth LFSR 318 to output a datum "A00⊕C00⊕G00" as the feedback datum. The feedback datum "A00⊕C00⊕G00" may be inputted to all of the second to fourth XOR arithmetic elements 322~324 and may be stored into the first LFSR 311. The fourth XOR arithmetic element 324 may perform an XOR operation to the previous datum "B00⊕F00" stored in the first LFSR 311 and the feedback datum "A00⊕C00⊕G00" outputted from the first XOR arithmetic element 321 to output a datum "B00⊕F00⊕A00⊕C00⊕G00" and the output datum "B00⊕F00⊕A00⊕C00⊕G00" of the fourth XOR arithmetic element 324 may be stored into the second LFSR 312.

The third XOR arithmetic element 323 may perform an XOR operation to the previous datum "A00⊕E00⊕B00⊕F00" stored in the second LFSR 312 and the feedback datum "A00⊕C00⊕G00" outputted from the first XOR arithmetic element 321 to output a datum "A00⊕E00⊕B00⊕F00⊕A00⊕C00⊕G00", and the output datum "A00⊕E00⊕B00⊕F00⊕A00⊕C00⊕G00" of the third XOR arithmetic element 323 may be stored into the third LFSR 313. The previous datum "D00⊕A00⊕E00⊕B00⊕F00" stored in the third LFSR 313 may be transmitted to the fourth LFSR 314. The second XOR arithmetic element 322 may perform an XOR operation to the previous datum "C00⊕D00⊕A00⊕E00" stored in the fourth LFSR 314 and the feedback datum "A00⊕C00⊕G00" outputted from the first XOR arithmetic element 321 to output a datum "C00⊕D00⊕A00⊕E00⊕A00⊕C00⊕G00", and the output datum "C00⊕D00⊕A00⊕E00⊕A00⊕C00⊕G00" of the second XOR arithmetic element 322 may be stored into the fifth LFSR 315. The previous datum "B00⊕C00⊕D00⊕B00⊕F00" stored in the fifth LFSR 315 may be transmitted to the sixth LFSR 316. The previous datum "A00⊕B00⊕C00⊕A00⊕E00" stored in the sixth LFSR 316 may be transmitted to the seventh LFSR 317. The previous datum "A00⊕B00⊕D00" stored in the seventh LFSR 317 may be transmitted to the eighth LFSR 318. As a result, the data "A00⊕C00⊕G00", "B00⊕F00⊕A00⊕C00⊕G00", "A00⊕E00⊕B00⊕F00⊕A00⊕C00⊕G00", "D00⊕A00⊕E00⊕B00⊕F00", "C00⊕D00⊕A00⊕E00⊕A00⊕C00⊕G00", "B00⊕C00⊕D00⊕B00⊕F00", "A00⊕B00⊕C00⊕A00⊕E00" and "A00⊕B00⊕D00" may be respectively stored into the first to eighth LFSRs 311 to 318 during the seventh clock cycle.

FIG. 14 is a relationship table between the iterative operation logic of FIG. 3 and simplified logic for the ECC encoding operation according to an embodiment of the present disclosure.

Referring to FIG. 14, a first column (denoted as "XOR-EQUATION") of the table shows each of the data finally stored in the first to eighth LFSRs 311 to 318 (i.e., each of the parity bit values included in the codeword) expressed by an XOR operation to the arbitrary variables allocated to the original data of exemplary 7 bits. For example, the datum finally stored in the third LFSR 313 may correspond to a value of a third parity bit among the parity bits included in the codeword. That is, a result of the XOR operation "A00⊕E00⊕B00⊕F00⊕A00⊕C00⊕G00" may correspond to the third parity bit value of the codeword.

Referring to the first column of the table in FIG. 14, the XOR operation is sometimes performed to the same variables. In such a case, the XOR operation to the same variables may produce a logic "0". Thus the XOR operations to the same variables are required to be simplified based on the nature of the XOR operation. That is, since an XOR operation to the same data produces a logic "0", removal of the XOR operation to the same variables does not affect the final result of the whole XOR operations. Accordingly, if an XOR operation is performed to the same variables, the XOR operation to the same variables may be removed to simplify an implementation of the ECC encoding operation.

For example, the XOR operation "A00⊕E00⊕B00⊕F00⊕A00⊕C00⊕G00" producing the data finally stored in the third LFSR 313 may include an XOR operation of "A00⊕A00". Thus, the XOR operation of "A00⊕A00" may be removed from the XOR operation "A00⊕E00⊕B00⊕F00⊕A00⊕C00⊕G00" to obtain a simplified XOR operation "E00⊕B00⊕F00⊕C00⊕G00". In addition, the XOR operation "C00⊕D00⊕A00⊕E00⊕A00⊕C00⊕G00" producing the data finally stored in the fifth LFSR 315 may include XOR operations of "A00⊕A00" and "C00⊕C00". Thus, the XOR operations of "A00⊕A00" and "C00⊕C00" may be removed from the XOR operation "C00⊕D00⊕A00⊕E00⊕A00⊕C00⊕G00" to obtain a simplified XOR operation "D00⊕E00⊕G00". Furthermore, the XOR operation "B00⊕C00⊕D00⊕B00⊕F00" producing the data finally stored in the sixth. LFSR 316 may include an XOR operation of "B00⊕B00". Thus, the XOR operation of "B00⊕B00" may be removed from the XOR operation "B00⊕C00⊕D00⊕B00⊕F00" to obtain a simplified XOR operation "C00⊕D00⊕F00". Moreover, the XOR operation "A00⊕B00⊕C00⊕A00⊕E00" producing the data finally stored in the seventh LFSR 317 may include an XOR operation of "A00⊕A00". Thus, the XOR operation of "A00⊕A00" may be removed from the XOR operation "A00⊕B00⊕C00⊕A00⊕E00" to obtain a simplified XOR operation "B00⊕C00⊕E00".

A second column (denoted as "SIMPLIFIED XOR-EQUATIONS WITHOUT DUPLICATE VARIABLES") of the table in FIG. 14 shows the simplified XOR operations corresponding to the original XOR operations of the first column. A third column (denoted as "PARITY BIT VALUES (EXAMPLE)") of the table in FIG. 14 shows an example result of the simplified XOR operations when the original data has the values of '1010110'. As described with reference to FIG. 5, if the 7-bit original data have a combination of '1010110', the variables "A00", "B00", "C00", "D00", "E00", "F00" and "G00" may respectively have a datum "0", a datum "1", a datum "1", a datum "0", a datum "1", a datum "0" and a datum "1". If the data of the variables "A00 to G00" are substituted into the simplified XOR equations of FIG. 14, data "0", "1", "0", "0", "0", "1", "1" and "1" may be respectively stored into the first to eighth LFSRs 311 to 318. Thus, the parity having a combination of '01000111' may be outputted, and the parity data '01000111' may be identical to the data of the parity bits generated by the iteration operation to the original data having a combination of '0110101' as described with reference to FIG. 4 (i.e., identical to the original XOR operations of the first column in the table of FIG. 14). Accordingly, in the event that a logic circuit is realized based on the original XOR operations of the first column in the table or the simplified XOR operations of the second column in the table of FIG. 14, an ECC encoding operation may be performed even for one clock cycle when the data of the parity bits are simultaneously outputted in parallel.

Figure 15:
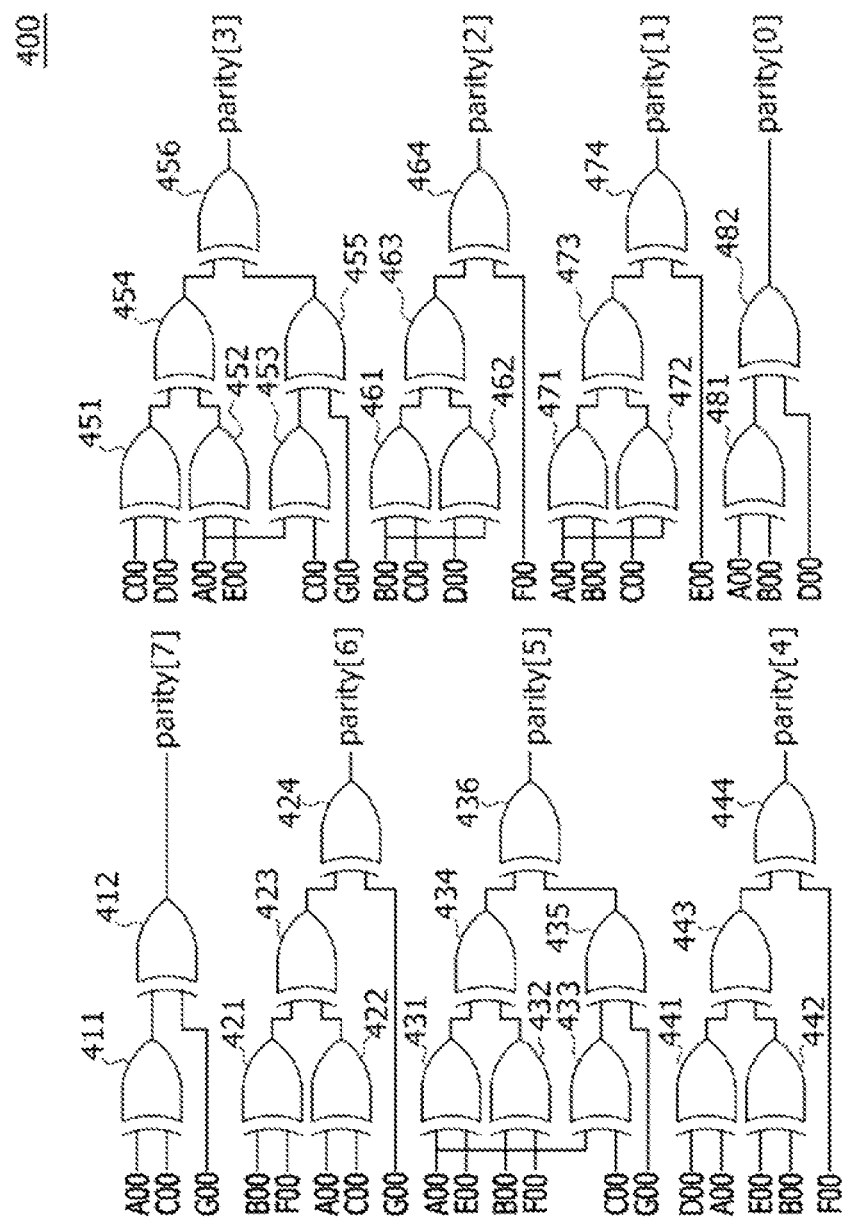
FIG. 15 is a circuit diagram illustrating an ECC encoder implemented by XOR gates realizing the iterative operation logic of FIG. 3.

FIG. 15 is a circuit diagram illustrating the ECC encoder 110 implemented by XOR gates realizing the iterative operation logic of FIG. 3. FIG. 15 shows a logic circuit according to the original XOR operations of the first column in the table of FIG. 14.

Referring to FIG. 15, the ECC encoder 400 may receive seven input data (i.e., first to seventh input data) in parallel to output eight output data (i.e., first to eighth output data corresponding to parity[7] to parity[0]) in parallel. The input data may correspond to arbitrary variables A00 to G00 as described with reference to FIG. 5. The output data (parity [7] to parity[0]) may correspond to data of parity bits included in a codeword. The first output datum (the parity [7]) may be generated by operations of first and second XOR arithmetic elements 411 and 412. The first XOR arithmetic element 411 may receive the arbitrary variable "A00" and the arbitrary variable "C00". The second XOR arithmetic element 412 may receive an output datum of the first XOR arithmetic element 411 and the arbitrary variable "G00". The first and second XOR arithmetic elements 411 and 412 may perform an operation to the XOR equation "A00⊕C00⊕G00". The first output datum (the parity[7]) outputted from the second XOR arithmetic element 412 may correspond to the datum finally stored in the first LFSR 311 (i.e., a datum of the first bit of the parity), as described with reference to FIG. 14.

The second output datum (the parity[6]) may be generated by operations of third to sixth XOR arithmetic elements 421, 422, 423 and 424. The third XOR arithmetic element 421 may receive the arbitrary variable "B00" and the arbitrary variable "F00". The fourth XOR arithmetic element 422 may receive the arbitrary variable "A00" and the arbitrary variable "C00". The fifth XOR arithmetic element 423 may receive an output datum of the third XOR arithmetic element 421 and an output datum of the fourth XOR arithmetic element 422. The sixth XOR arithmetic element 424 may receive an output datum of the fifth XOR arithmetic element 423 and the arbitrary variable "G00". The third to sixth XOR arithmetic elements 421 422, 423 and 424 may perform an operation to the XOR equation "B00⊕F00⊕A00⊕C00⊕G00". The second output datum (the parity[6]) outputted from the sixth XOR arithmetic element 424 may correspond to the datum finally stored in the second LFSR 312 (i.e., a datum of the second bit of the parity), as described with reference to FIG. 14.

The third output datum (the parity[5]) may be generated by operations of seventh to twelfth XOR arithmetic elements 431, 432, 433, 434, 435 and 436. The seventh XOR arithmetic element 431 may receive the arbitrary variable "A00" and the arbitrary variable "E00". The eighth XOR arithmetic element 432 may receive the arbitrary variable "B00" and the arbitrary variable "F00". The ninth XOR arithmetic element 433 may receive the arbitrary variable "A00" and the arbitrary variable "C00". The tenth XOR arithmetic element 434 may receive an output datum of the seventh XOR arithmetic element 431 and an output datum of the eighth XOR arithmetic element 432. The eleventh XOR arithmetic element 435 may receive an output datum of the ninth XOR arithmetic element 433 and the arbitrary variable "G00". The twelfth XOR arithmetic element 436 may receive an output datum the tenth XOR arithmetic element 434 and an output datum of the eleventh XOR arithmetic element 435. The seventh to twelfth XOR arithmetic elements 431, 432, 433, 434, 435 and 436 may perform an operation to the XOR equation "A00⊕E00⊕B00⊕F00⊕A00⊕C00⊕G00". The third output datum (the parity[5]) outputted from the twelfth XOR arithmetic element 436 may correspond to the datum finally stored in the third LFSR 313 (i.e., a datum of the third bit of the parity), as described with reference to FIG. 14.

The fourth output datum (the parity [4]) may be generated by operations of thirteenth to sixteenth XOR arithmetic elements 441 442 443 and 444. The thirteenth XOR arithmetic element 441 may receive the arbitrary variable "D00" and the arbitrary variable "A00". The fourteenth XOR arithmetic element 442 may receive the arbitrary variable "E00" and the arbitrary variable "B00". The fifteenth XOR arithmetic element 443 may receive an output datum of the thirteenth XOR arithmetic element 441 and an output datum of the fourteenth XOR arithmetic element 442. The sixteenth XOR arithmetic element 444 may receive an output datum of the fifteenth XOR arithmetic element 443 and the arbitrary variable "F00". The thirteenth to sixteenth XOR arithmetic elements 441, 442, 443 and 444 may perform an operation to the XOR equation "D00⊕A00⊕E00⊕B00⊕F00". The fourth output datum (the parity[4]) outputted from the sixteenth XOR arithmetic element 444 may correspond to the datum finally stored in the fourth LFSR 314 (i.e., a datum of the fourth bit of the parity), as described with reference to FIG. 14.

The fifth output datum (the parity[3]) may be generated by operations of seventeenth to twenty-second XOR arithmetic elements 451, 452, 453, 454, 455 and 456. The seventeenth XOR arithmetic element 451 may receive the arbitrary variable "C00" and the arbitrary variable "D00". The eighteenth XOR arithmetic element 452 may receive the arbitrary variable "A00" and the arbitrary variable "E00". The nineteenth XOR arithmetic element 453 may receive the arbitrary variable "A00" and the arbitrary variable "C00". The twentieth XOR arithmetic element 454 may receive an output datum of the seventeenth XOR arithmetic element 451 and an output datum of the eighteenth XOR arithmetic element 452. The twenty-first XOR arithmetic element 455 may receive an output datum of the nineteenth XOR arithmetic element 453 and the arbitrary variable "G00". The twenty-second XOR arithmetic element 456 may receive an output datum of the twentieth XOR arithmetic element 454 and an output datum of the twenty-first XOR arithmetic element 455. The seventeenth to twenty-second XOR arithmetic elements 451, 452, 453, 454, 455 and 456 may perform an operation to the XOR equation "C00⊕D00⊕A00⊕E00⊕A00⊕C00⊕G00". The fifth output datum (the parity[3]) outputted from the twenty-second XOR arithmetic element 456 may correspond to the datum finally stored in the fifth LFSR 315 (i.e., a datum of the fifth bit of the parity), as described with reference to FIG. 14.

The sixth output datum (the parity[2]) may be generated by operations of twenty-third to twenty-sixth XOR arithmetic elements 461, 462, 463 and 464. The twenty-third XOR arithmetic element 461 may receive the arbitrary variable "B00" and the arbitrary variable "C00". The twenty-fourth XOR arithmetic element 462 may receive the arbitrary variable "B00" and the arbitrary variable "D00". The twenty-fifth XOR arithmetic element 463 may receive an output datum of the twenty-third XOR arithmetic element 461 and an output datum of the twenty-fourth XOR arithmetic element 462. The twenty-sixth XOR arithmetic element 464 may receive an output datum of the twenty-fifth XOR arithmetic element 463 and the arbitrary variable "F00". The twenty-third to twenty-sixth XOR arithmetic elements 461, 462, 463 and 464 may perform an operation to the XOR equation "B00⊕C00⊕D00⊕B00⊕F00". The sixth output datum (the parity[2]) outputted from the twenty-sixth XOR arithmetic element 464 may correspond to the datum finally stored in the sixth LFSR 316 (i.e., a datum of the sixth bit of the parity), as described with reference to FIG. 14.

The seventh output datum (the parity[1]) may be generated by operations of twenty-seventh to thirtieth XOR arithmetic elements 471, 472, 473 and 474. The twenty-seventh XOR arithmetic element 471 may receive the arbitrary variable "A00" and the arbitrary variable "B00". The twenty-eighth XOR arithmetic element 472 may receive the arbitrary variable "A00" and the arbitrary variable "C00". The twenty-ninth XOR arithmetic element 473 may receive an output datum of the twenty-seventh XOR arithmetic element 471 and an output datum of the twenty-eighth XOR arithmetic element 472. The thirtieth XOR arithmetic element 474 may receive an output datum of the twenty-ninth XOR arithmetic element 473 and the arbitrary variable "E00". The twenty-seventh to thirtieth XOR arithmetic elements 471, 472, 473 and 474 may perform an operation to the XOR equation "A00⊕B00⊕C00⊕A00⊕E00". The seventh output datum (the parity[1]) outputted from the thirtieth XOR arithmetic element 474 may correspond to the datum finally stored in the seventh LFSR 317 (i.e., a datum of the seventh bit of the parity), as described with reference to FIG. 14.

The eighth output datum (the parity[0]) may be generated by operations of thirty-first and thirty-second XOR arithmetic elements 481 and 482. The thirty-first XOR arithmetic element 481 may receive the arbitrary variable "A00" and the arbitrary variable "B00". The thirty-second XOR arithmetic element 482 may receive an output datum of the thirty-first XOR arithmetic element 481 and the arbitrary variable "D00". The thirty-first and thirty-second XOR arithmetic elements 481 and 482 may perform an operation to the XOR equation "A00⊕B00⊕D00". The eighth output datum (the parity[0]) outputted from the thirty-second XOR arithmetic element 482 may correspond to the datum finally stored in the eighth LFSR 318 (i.e., a datum of the eighth bit of the parity), as described with reference to FIG. 14.

As described above, the ECC encoder 400 according to an embodiment may be realized using a logic circuit based on the XOR equations including the duplicate operations. As a result, thirty two XOR arithmetic elements (e.g., 32 XOR gates) may be required to realize the ECC encoder 400. Since the ECC encoding operation is performed using only the XOR operations of the arbitrary variables "A00 to G00" inputted in parallel the output data of the ECC encoder 400 corresponding to the parity bits (parity[7] to parity[0]) of the codeword may also be outputted in parallel. In addition, the ECC encoding operation may be performed in one clock cycle.

Figure 16:
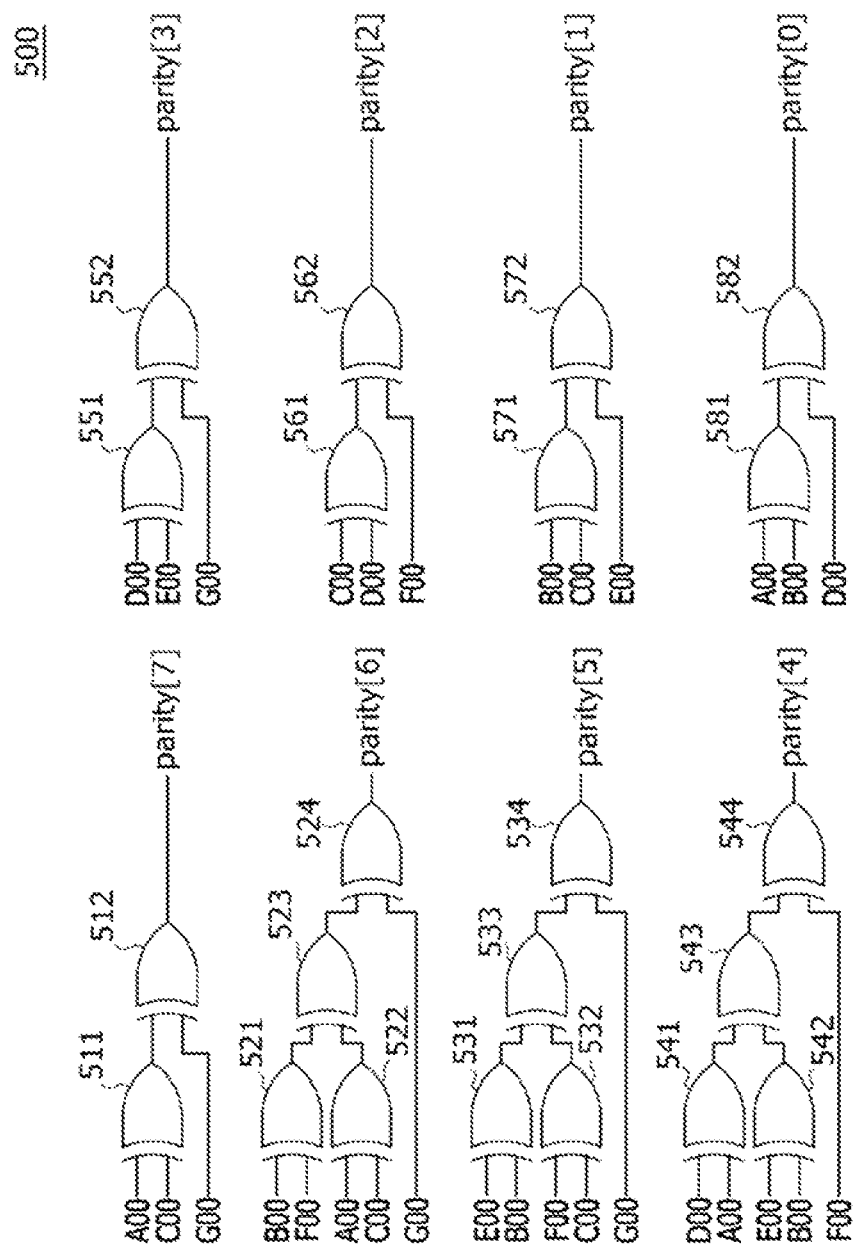
FIG. 16 is a circuit diagram illustrating an ECC encoder implemented by XOR gates realizing the simplified logic.

FIG. 16 is a circuit diagram illustrating the ECC encoder 110 implemented by XOR gates realizing a simplified logic circuit according to the simplified XOR equations without duplicate variables of the second column in the table of FIG. 14 equations without duplicate operations Referring to FIG. 16, the ECC encoder 500 may receive seven input data (i.e., first to seventh input data) in parallel to output eight output data (i.e., first to eighth output data corresponding to parity[7] to parity[0]) in parallel. The input data may correspond to arbitrary variables A00 to G00 as described with reference to FIG. 5. The output data (parity [7] to parity[0]) may correspond to data of parity bits included in a code word.

The first output datum (the parity[7]) may be generated by operations of first and second XOR arithmetic elements 511 and 512. The first XOR arithmetic element 511 may receive the arbitrary variable "A00" and the arbitrary variable "C00". The second XOR arithmetic element 512 may receive an output datum of the first XOR arithmetic element 511 and the arbitrary variable "G00". The first and second XOR arithmetic elements 511 and 512 may perform an operation to the XOR equation "A00⊕C00⊕G00". The first output datum (the parity[7]) outputted from the second XOR arithmetic element 512 may correspond to the datum finally stored in the first LFSR 311 (i.e., a datum of the first bit of the parity), as described with reference to FIG. 14.

The second output datum (the parity[6]) may be generated by operations of third to sixth XOR arithmetic elements 521, 422, 423 and 524. The third XOR arithmetic element 521 may receive the arbitrary variable "B00" and the arbitrary variable "F00". The fourth XOR arithmetic element 522 may receive the arbitrary variable "A00" and the arbitrary variable "C00". The fifth XOR arithmetic element 523 may receive an output datum of the third XOR arithmetic element 521 and an output datum of the fourth XOR arithmetic element 522. The sixth XOR arithmetic element 524 may receive an output datum of the fifth XOR arithmetic element 523 and the arbitrary variable "G00". The third to sixth XOR arithmetic elements 521 522, 523 and 524 may perform an operation to the XOR equation "B00⊕F00⊕A00⊕C00⊕G00". The second output datum (the parity[6]) outputted from the sixth XOR arithmetic element 524 may correspond to the datum finally stored in the second LFSR 312 (i.e., a datum of the second bit of the parity), as described with reference to FIG. 14.

The third output datum (the parity[5]) may be generated by operations of seventh to tenth XOR arithmetic elements 531, 532, 533 and 534. The seventh XOR arithmetic element 531 may receive the arbitrary variable "E00" and the arbitrary variable "B00". The eighth XOR arithmetic element 532 may receive the arbitrary variable "F00" and the arbitrary variable "C00". The ninth XOR arithmetic element 533 may receive an output datum of the seventh XOR arithmetic element 531 and an output datum of the eighth XOR arithmetic element 532. The tenth XOR arithmetic element 534 may receive an output datum of the ninth XOR arithmetic element 533 and the arbitrary variable "G00". The seventh to tenth XOR arithmetic elements 531, 532, 533 and 534 may perform an operation to the XOR equation "E00⊕B00⊕F00⊕C00⊕G00". The third output datum (the parity[5]) outputted from the tenth XOR arithmetic element 534 may correspond to the datum finally stored in the third LFSR 313 (i.e., a datum of the third bit of the parity), as described with reference to FIG. 14.

The fourth output datum (the parity[4]) may be generated by operations of eleventh to fourteenth XOR arithmetic elements 541, 542, 543 and 544. The eleventh XOR arithmetic element 541 may receive the arbitrary variable "D00" and the arbitrary variable "A00". The twelfth XOR arithmetic element 542 may receive the arbitrary variable "E00" and the arbitrary variable "B00". The thirteenth XOR arithmetic element 543 may receive an output datum of the eleventh XOR arithmetic element 541 and an output datum of the twelfth XOR arithmetic element 542. The fourteenth XOR arithmetic element 544 may receive an output datum of the thirteenth XOR arithmetic element 543 and the arbitrary variable "F00". The eleventh to fourteenth XOR arithmetic elements 541, 542, 543 and 544 may perform an operation to the XOR equation "D00⊕A00⊕E00⊕B00⊕F00". The fourth output datum (the parity[4]) outputted from the fourteenth XOR arithmetic element 544 may correspond to the datum finally stored in the fourth LFSR 314 (i.e., a datum of the fourth bit of the parity), as described with reference to FIG. 14.

The fifth output datum (the parity[3]) may be generated by operations of fifteenth and sixteenth XOR arithmetic elements 551 and 552. The fifteenth XOR arithmetic element 551 may receive the arbitrary variable "D00" and the arbitrary variable "E00". The sixteenth XOR arithmetic element 552 may receive an output datum of the fifteenth XOR arithmetic element 551 and the arbitrary variable "G00". The fifteenth and sixteenth XOR arithmetic elements 551 and 552 may perform an operation to the XOR equation "D00⊕E00⊕G00". The fifth output datum (the parity[3]) outputted from the sixteenth XOR arithmetic element 552 may correspond to the datum finally stored in the fifth LFSR 315 a datum of the fifth bit of the parity), as described with reference to FIG. 14.

The sixth output datum (the parity[2]) may be generated by operations of seventeenth and eighteenth XOR arithmetic elements 561 and 562. The seventeenth XOR arithmetic element 561 may receive the arbitrary variable "C00" and the arbitrary variable "D00". The eighteenth XOR arithmetic element 562 may receive an output datum of the seventh XOR arithmetic element 561 and the arbitrary variable "F00". The seventh and eighteenth XOR arithmetic elements 561 and 562 may perform an operation to the XOR equation "C00⊕D00⊕F00". The sixth output datum (the parity[2]) outputted from the eighteenth XOR arithmetic element 562 may correspond to the datum finally stored in the sixth LFSR 316 (i.e., a datum of the sixth bit of the parity), as described with reference to FIG. 14.

The seventh output datum the parity[1]) may be generated by operations of nineteenth and twentieth XOR arithmetic elements 571 and 572. The nineteenth XOR arithmetic element 571 may receive the arbitrary variable "B00" and the arbitrary variable "C00". The twentieth XOR arithmetic element 572 may receive an output datum of the nineteenth XOR arithmetic element 571 and the arbitrary variable "E00". The twenty-seventh to thirtieth XOR arithmetic elements 471, 472, 473 and 474 may perform an operation to the XOR equation "B00⊕C00⊕E00". The seventh output datum (the parity[1]) outputted from the twentieth XOR arithmetic element 572 may correspond to the datum finally stored in the seventh LFSR 317 (i.e., a datum of the seventh bit of the parity), as described with reference to FIG. 14.

The eighth output datum (the parity[0]) may be generated by operations of twenty-first and twenty-second XOR arithmetic elements 581 and 582. The twenty-first XOR arithmetic element 581 may receive the arbitrary variable "A00" and the arbitrary variable "B00". The twenty-second XOR arithmetic element 582 may receive an output datum of the twenty-first XOR arithmetic element 581 and the arbitrary variable "D00". The twenty-first and twenty-second XOR arithmetic elements 581 and 582 may perform an operation to the XOR equation "A00⊕B00⊕D00". The eighth output datum (the parity[0]) outputted from the twenty-second XOR arithmetic element 582 may correspond to the datum finally stored in the eighth LFSR 318 a datum of the eighth bit of the parity), as described with reference to FIG. 14.

As described above, the ECC encoder 500 according to another embodiment may be realized using a logic circuit based on the simplified XOR equations without duplicate operations. As a result, only twenty two XOR arithmetic elements (e.g., 32 XOR gates) may be required to realize the ECC encoder 500. Since the ECC encoding operation is performed using only the XOR operations of the arbitrary variables "A00 to G00" inputted in parallel, the output data of the ECC encoder 500 corresponding to the parity bits (parity[7] to parity[0]) of the codeword may also be outputted in parallel. In addition, the ECC encoding operation may be performed in one clock cycle.

According to the embodiments, XOR equations for an ECC encoding operation may be extracted using XOR arithmetic elements (e.g., XOR gates) and linear feedback shift registers (LFSRs). Thus, any one of ECC encoders according to the embodiments may be realized using only XOR arithmetic elements (e.g., XOR gates), and the ECC encoders may perform the ECC encoding operation for one clock cycle.

The embodiments of the present disclosure have been disclosed above for illustrative purposes. Those of ordinary skill in the art will appreciate that various modifications, additions, and substitutions are possible, without departing from the scope and spirit of the present disclosure as claimed below.

What is claimed is:

1. An error correction code (ECC) encoder configured to perform an ECC encoding operation comprising:

a plurality of exclusive OR (XOR) gates configured to receive, directly from outside the ECC encoder without going through any shift register, a "k"-bit original data in parallel and configured to perform a plurality of XOR operations to the "k"-bit original data to output a "(n−k)"-bit parity data, wherein the "k"-bit original data and the "(n−k)"-bit parity data form an "n"-bit codeword, "k" denotes a natural number and "n" denotes a natural number which is greater than "k", and wherein the operation of the ECC encoder is performed for one clock cycle.

2. The ECC encoder of claim 1, wherein the plurality of XOR operations are performed using arbitrary variables as input data; and wherein the plurality of XOR gates constitute a logic circuit so that the parity bit data of the "(n−k)"-bit parity are generated by XOR equations which are expressed by only the XOR operations.

3. The ECC encoder of claim 2, wherein the arbitrary variables correspond to the data of the bits included in the "k"-bit original data, respectively.

4. The ECC encoder of claim 3, wherein the XOR equations are set by respectively allocating the arbitrary variables to the bits of the "k"-bit original data, by realizing an iterative operation logic circuit for ECC encoding that includes a plurality of linear feedback shift registers (LFSRs) and a plurality of XOR gates to execute an iterative operation "k" times using the arbitrary variables as input data, by performing the iterative operation "k" times using the iterative operation logic circuit, and by extracting equations based on data stored in the LFSRs after the $k^{th}$ iterative operation.

5. The ECC encoder of claim 4, wherein the number of the LFSRs for realizing the iterative operation logic circuit for ECC encoding is "(n−k)" corresponding to the number of bits included in the "(n−k)"-bit parity data used in error correction.

6. The ECC encoder of claim 5, wherein the number "(n−k)" of bits included in the "(n−k)"-bit parity data is equal to or less than m×t where, 't' is error correction capability and 'm' is an integer which is equal to or greater than three.

7. The ECC encoder of claim 6, wherein each of the XOR equations is simplified by removing duplicate arbitrary variables from any one of the data stored in the LFSRs after the $k^{th}$ iterative operation.

8. A memory controller comprising:

an error correction code (ECC) encoder configured to perform an ECC encoding operation to "k"-bit original data, which are to be written into a memory device, to generate an "n"-bit codeword including the original data and corresponding parity bits; and an ECC decoder configured to perform an ECC decoding operation to the codeword read from the memory device, wherein the ECC encoder includes a plurality of exclusive OR (XOR) gates configured to directly receive, directly from outside the ECC encoder without going through any shift register, a "k"-bit original data in parallel and perform a plurality of XOR operations to the "k"-bit original data to output a "(n−k)"-bit parity, and wherein the "k"-bit original data and the "(n−k)"-bit parity data form an "n"-bit codeword, "k" denotes a natural number and "n" denotes a natural number which is greater than "k", and wherein the operation of the ECC encoder is performed for one clock cycle.

9. The memory controller of claim 8,
wherein the plurality of XOR operations are performed using arbitrary variables as input data; and
wherein the plurality of XOR gates constitute a logic circuit so that the parity bit data of the "(n−k)"-bit parity data are generated by XOR equations which are expressed by only the XOR operations.

10. The memory controller of claim 9, wherein the arbitrary variables correspond to the data of the bits included in the "k"-bit original data, respectively.

11. The memory controller of claim 10, wherein the XOR equations are set by respectively allocating the arbitrary variables to the bits of the "k"-bit original data, by realizing an iterative operation logic circuit for ECC encoding that includes a plurality of linear feedback shift registers (LFSRs) and a plurality of XOR gates to execute an iterative operation "k" times using the arbitrary variables as input data, by performing the iterative operation "k" times using the iterative operation logic circuit, and by extracting equations based on data stored in the LFSRs after the $k^{th}$ iterative operation.

12. The memory controller of claim 11, wherein the number of the LFSRs in the iterative operation logic circuit for ECC encoding is "(n−k)" corresponding to the number of bits included in the "(n−k)"-bit parity data used in error correction.

13. The memory controller of claim 12, wherein the number "(n−k)" of bits included in the "(n−k)"-bit parity data is equal to or less than m×t, where, 't' is error correction capability and 'm' is an integer which is equal to or greater than three.

14. The memory controller of claim 13, wherein each of the XOR equations is set by removing duplicate arbitrary variables from any one of the data stored in the LFSRs after the $k^{th}$ iterative operation.

15. An error correction code (ECC) encoding method comprising:
realizing an iterative operation logic circuit that includes a plurality of linear feedback shift registers (LFSRs) and a plurality of XOR gates to execute an iterative operation "k" times;
allocating arbitrary variables to the "k"-bit original data, respectively;
performing the iterative operation "k" times with the iterative operation logic circuit using the arbitrary variables as input data;
extracting equations that are expressed by XOR operations of the arbitrary variables based on data stored in the LFSRs after the kth iterative operation;
extracting exclusive OR (XOR) equations, each of which is expressed by only XOR operations of arbitrary variables to obtain any one of bit data of a parity included in a codeword;
removing duplicate arbitrary variables from each of the XOR equations;
realizing an ECC encoder which is comprised of a plurality of XOR gates to execute the XOR equations; and
inputting bit data of "k"-bit original data in parallel directly from outside the ECC encoder to the plurality of XOR gates to output the bit data of the parity without going through any shift register, which are generated by the plurality of XOR gates, in parallel.

16. The ECC encoding method of claim 15, wherein the number of the LFSRs in the iterative operation logic circuit is "(n−k)" corresponding to the number of bits included in the parity data used in error correction.

17. The ECC encoding method of claim 16, wherein the number "(n−k)" of bits included in the parity is equal to or less than m×t, 't' is error correction capability and 'm' is an integer which is equal to or greater than three.

* * * * *